(12) United States Patent
Yeo et al.

(10) Patent No.: US 10,972,691 B2
(45) Date of Patent: Apr. 6, 2021

(54) DYNAMIC VISION SENSOR, ELECTRONIC DEVICE AND DATA TRANSFER METHOD THEREOF

(71) Applicant: SAMSUNG ELECTRONICS CO., LTD., Suwon-si (KR)

(72) Inventors: Dong Hee Yeo, Seoul (KR); Hyun Surk Ryu, Hwaseong-si (KR); Hee Jae Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 16/244,763

(22) Filed: Jan. 10, 2019

(65) Prior Publication Data

US 2019/0364237 A1    Nov. 28, 2019

(30) Foreign Application Priority Data

May 24, 2018    (KR) ........................ 10-2018-0058983

(51) Int. Cl.
| | | |
|---|---|---|
| *H04N 5/374* | (2011.01) | |
| *H04N 5/3745* | (2011.01) | |
| *G06K 9/00* | (2006.01) | |
| *H01L 27/146* | (2006.01) | |
| *H03K 5/08* | (2006.01) | |

(52) U.S. Cl.
CPC ....... *H04N 5/3745* (2013.01); *G06K 9/00973* (2013.01); *H01L 27/14609* (2013.01); *H03K 5/082* (2013.01)

(58) Field of Classification Search
CPC ...... H04N 5/3745; H04N 5/341; H04N 5/374; H04N 5/2253; H04N 5/335; H04N 7/18; G06K 9/00973; G06K 9/00684; G06K 2009/00738; H01L 27/14609; H03K 5/082

See application file for complete search history.

(56) References Cited

U.S. PATENT DOCUMENTS

| | | | |
|---|---|---|---|
| 8,426,793 B1 | 4/2013 | Barrows | |
| 9,389,693 B2 | 7/2016 | Lee et al. | |
| 9,451,142 B2 | 9/2016 | McGarry et al. | |
| 9,660,622 B2 | 5/2017 | Kim et al. | |
| 2016/0094796 A1* | 3/2016 | Govil | H04N 5/3456 348/295 |
| 2016/0203610 A1 | 7/2016 | Lee et al. | |
| 2017/0053407 A1 | 2/2017 | Benosman et al. | |
| 2019/0364230 A1 | 11/2019 | Yeo et al. | |

FOREIGN PATENT DOCUMENTS

KR    10-2019-0133465 A    12/2019

* cited by examiner

*Primary Examiner* — Twyler L Haskins
*Assistant Examiner* — Angel L Garces-Rivera
(74) *Attorney, Agent, or Firm* — Sughrue Mion, PLLC

(57) ABSTRACT

A dynamic vision sensor includes a pixel unit, including a plurality of pixels outputting an activation signal in response to dynamic input, a first reading unit outputting a first signal, based on the activation signal, a second reading unit outputting a second signal, based on the activation signal, an event counter counting the number of events generated, based on the activation signal, and generating and outputting a selection signal, based on the number of events, and a selecting unit outputting one of the first signal and the second signal, based on the selection signal.

13 Claims, 6 Drawing Sheets

DYNAMIC VISION SENSOR, ELECTRONIC DEVICE AND DATA TRANSFER METHOD THEREOF

CROSS-REFERENCE TO RELATED APPLICATION(S)

This application claims priority to Korean Patent Application No. 10-2018-0058983 filed on May 24, 2018, in the Korean Intellectual Property Office, the disclosure of which is herein incorporated by reference in its entirety.

BACKGROUND

1. Field

Methods and apparatuses consistent with embodiments of this disclosure relate to a dynamic vision sensor, an electronic device, and a data transfer method thereof.

2. Description of Related Art

A dynamic vision sensor (DVS) is a sensor that senses a change of light incident thereto and generates output based on the change of light. The DVS may generate and output data only using information on whether an event has occurred, in a manner different from a CMOS image sensor (CIS). Thus, a DVS has the advantages of the fast frame rate and low power, as compared with a CIS.

However, in the case of DVS, there may be the disadvantage in which an amount of data to be transferred is rapidly increased, as the number of events having occurred increases.

SUMMARY

Aspects of embodiments of this disclosure provide a dynamic vision sensor, an electronic device, and a data transfer method thereof, capable of preventing an excessive amount of data transferred by a dynamic vision sensor.

According to an aspect of an embodiment, there is provided a dynamic vision sensor including: a pixel unit comprising a plurality of pixels, each pixel among the plurality of pixels configured to output an activation signal indicating occurrence of an event, in response to receiving dynamic input; a first reading unit configured to output a first signal, based on the activation signal; a second reading unit configured to output a second signal, based on the activation signal; an event counter configured to count a number of events occurring in the pixel unit, based on the activation signal, and to output a selection signal, based on the number of events; and a selecting unit configured to select an output signal from among one of the first signal and the second signal, based on the selection signal, and to output the output signal.

According to an aspect of an embodiment, there is provided a dynamic vision sensor including: a pixel unit comprising a plurality of pixels, each pixel among the plurality of pixels configured to output an activation signal indicating occurrence of an event, in response to receiving dynamic input; a first reading unit configured to output a first signal, based on an activation signal; a second reading unit configured to output a second signal, based on the activation signal; an event counter configured to count a number of events occurring in the pixel unit, based on the activation signal, and to output a selection signal, based on the number of events; and a selecting unit configured to receive the activation signal and the selection signal, and to output the activation signal to one of the first reading unit and the second reading unit, based on the selection signal.

According to an aspect of an embodiment, there is provided an electronic device including: a dynamic vision sensor configured to sense events and output a first signal or a second signal according to a number of events; and a processor configured to process the first signal or the second signal received from the dynamic vision sensor.

According to an aspect of an embodiment, there is provided a data transfer method including: sensing events through a pixel array comprising a plurality of pixels; generating a first signal corresponding to the events according to a first method and a second signal corresponding to the events according to a second method; counting a number of events; comparing the number of events with a threshold value; and outputting the first signal or the second signal according to a result of the comparing.

According to an aspect of an embodiment, there is provided a data transfer method including: sensing events through a pixel array comprising a plurality of pixels; counting a number of events; comparing the number of events with a threshold value; and outputting a first signal corresponding to the events generated according to a first method or a second signal corresponding to the events generated according to a second method, based on a result of the comparing.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION OF EMBODIMENTS

Hereinafter, embodiments of the present disclosure will be described in detail with reference to the accompanying drawings.

Figure 1:
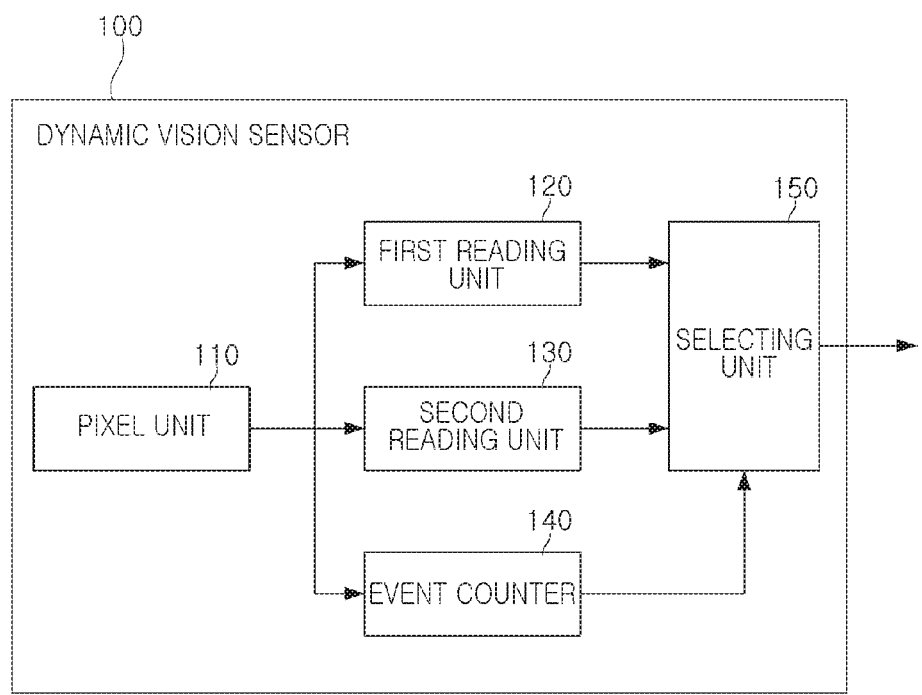
FIG. 1 is a block diagram of a dynamic vision sensor according to an embodiment.

FIG. 1 is a block diagram of a dynamic vision sensor according to an embodiment.

Referring to FIG. 1, a dynamic vision sensor 100 according to an embodiment may include a pixel unit 110, a first reading unit 120, a second reading unit 130, an event counter 140, and a selecting unit 150.

The pixel unit 110 may include a pixel array including a plurality of pixels.

The plurality of pixels, included in the pixel unit 110, may output an activation signal in response to dynamic input. Here, the dynamic input may include a change in light intensity which is incident to the pixels of the pixel unit 110. Moreover, the activation signal may be output when the change in light intensity, which is incident to each pixel of the pixel unit 110, exceeds a preset threshold value. In other words, the activation signal may indicate whether the change in light intensity incident to each of the pixels of the pixel unit 110 exceeds the threshold value.

The first reading unit 120 may receive an activation signal, output by the pixel unit 110, and may output a first signal, based on the activation signal. Here, the first signal may be an event signal, generated based on the activation signal, while the event signal may include information on a position of a pixel in which an event occurs (for example, an address of a pixel), information on time (for example, time stamp), information on an event, and the like.

The second reading unit 130 may receive an activation signal, output by the pixel unit 110, and may output a second signal based on the activation signal. Here, the second signal may be a signal scanning all pixels, included in the pixel unit 110, for each frame.

The event counter 140 may receive an activation signal, output by the pixel unit 110, and may count the number of events having occurred, based on the activation signal. For example, the event counter 140 may count the number of activation signals, and may thus count the number of events.

Moreover, the event counter 140 may generate a selection signal, based on the counted number of events, and may output the selection signal to the selecting unit 150. For example, the event counter 140 may output a first selection signal selecting an output signal of the first reading unit 120 if the number of events is less than a preset threshold value, and may output a second selection signal selecting an output signal of the second reading unit 130 if the number of events is equal to or greater than the preset threshold value. Here, the preset threshold value may be determined according to the number of pixels included in the pixel unit 110, which will be described later with reference to FIG. 3.

The selecting unit 150 may output one of an output signal of the first reading unit 120 and an output signal of the second reading unit 130 based on the selection signal received from the event counter 140. For example, the selecting unit 150 may output an output signal of the first reading unit 120, that is a first signal, in response to receiving a first selection signal from the event counter 140, and may output an output signal of the second reading unit 130, that is a second signal, in response to receiving a second selection signal from the event counter 140.

The dynamic vision sensor 100, illustrated in FIG. 1, is configured to output a first signal and a second signal by the first reading unit 120 and the second reading unit 130, respectively, regardless of a method for outputting data, and to select and output one of the first signal and the second signal.

Thus, the dynamic vision sensor 100 may output data at a point in time that the events occur and are counted. Thus, at the point in time at which the events occur, the number of events is provided.

Figure 2:
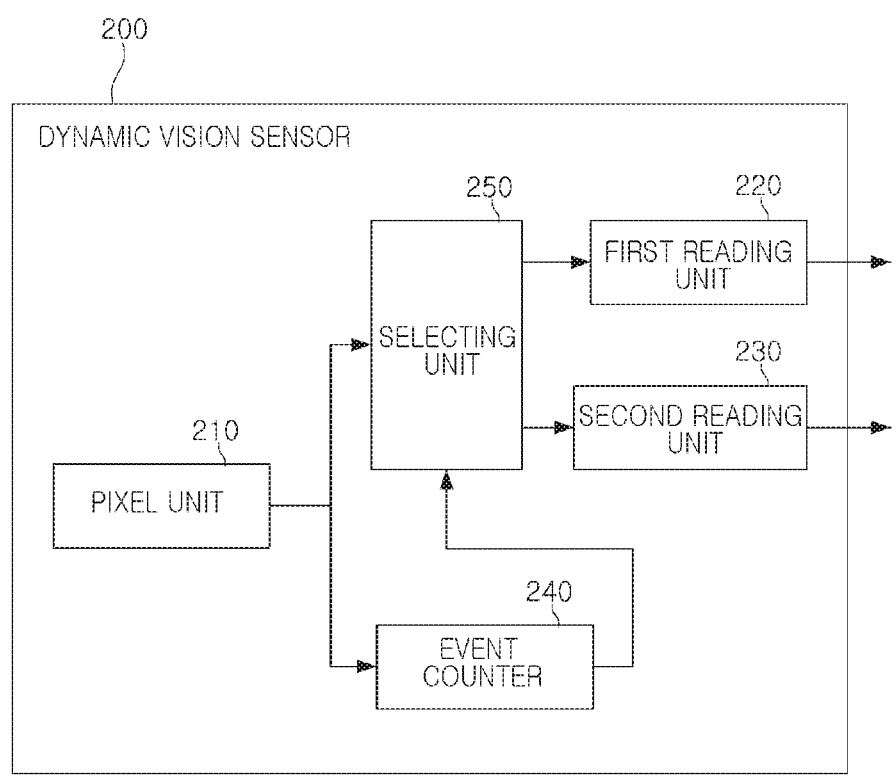
FIG. 2 is a block diagram of a dynamic vision sensor according to an embodiment.

FIG. 2 is a block diagram of a dynamic vision sensor according to an embodiment.

Referring to FIG. 2, a dynamic vision sensor 200 according to an embodiment may include a pixel unit 210, a first reading unit 220, a second reading unit 230, an event counter 240, and a selecting unit 250.

The dynamic vision sensor 200, illustrated in FIG. 2, is different from the dynamic vision sensor 100, illustrated in FIG. 1, in that the selecting unit 250 receives input from the pixel unit 210 and the event counter 240, and provides output to the first reading unit 220 and the second reading unit 230.

The event counter 240 may receive an activation signal, output by the pixel unit 210, and may count the number of events having occurred, based on the activation signal. For example, the event counter 240 may count the number of activation signals, and may thus count the number of events.

Moreover, the event counter 240 may generate a selection signal, based on the number of events having been counted, and may output the selection signal to the selecting unit 250. For example, the event counter 240 may output a first selection signal selecting the first reading unit 220 if the number of events is less than a preset threshold value, and may output a second selection signal selecting the second reading unit 230 if the number of events is equal to or greater than the preset threshold value. Here, the preset threshold value may be determined according to the number of pixels included in the pixel unit 210, which will be described later with reference to FIG. 3.

The selecting unit 250 may receive the activation signal, output by the pixel unit 210, and may output the activation signal to one of the first reading unit 220 and the second reading unit 230 based on the selection signal received from the event counter 240. For example, the selecting unit 250 may output an activation signal to the first reading unit 220 when receiving a first selection signal from the event counter 240, and may output an activation signal to the second reading unit 230 when receiving a second selection signal from the event counter 240.

Thus, one of the first reading unit 220 and the second reading unit 230 may receive an activation signal from the selecting unit 250 and may output a first signal or a second signal, based on the activation signal.

The remaining configuration, except for the configuration described above, is the same as that described with reference to FIG. 1, so a detailed description thereof will be omitted.

The dynamic vision sensor 200, illustrated in FIG. 2, is configured to output a signal through one of the reading units 220 and 230 having been selected, according to the number of events having occurred.

Thus, there is the advantage of reducing the power consumption of the dynamic vision sensor 200.

Figure 3:
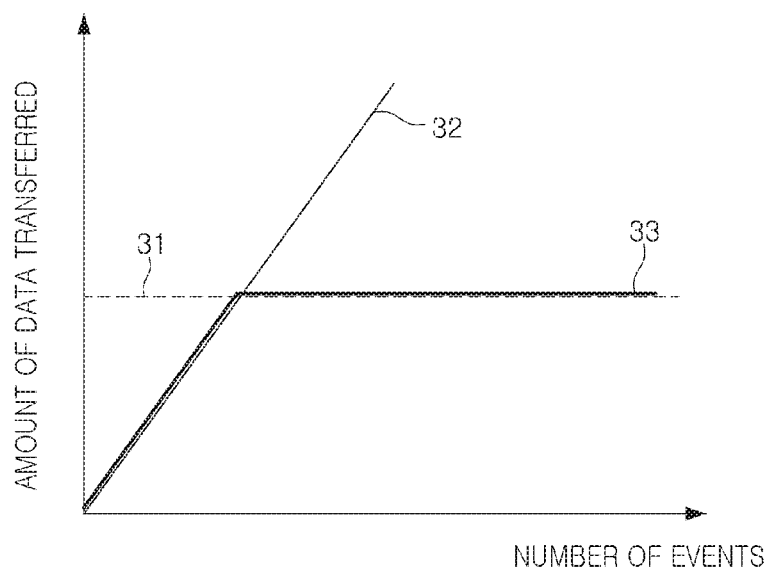
FIG. 3 is a graph illustrating an amount of data transferred according to the number of events generated, according to an embodiment.

FIG. 3 is a graph illustrating an amount of data transferred according to the number of events generated, according to an embodiment.

In the graph illustrated in FIG. 3, the amount of data transferred 31 denotes an amount of data transferred when a signal is output in the unit of a frame in a CIS, the amount of data transferred 32 denotes an amount of data transferred when an event signal is output in the unit of a frame in a DVS, and the amount of data 33 denotes an amount of data transferred according to the number of events in a DVS, according to an embodiment.

As illustrated in FIG. 3, in the case of CIS, data of all pixels is output for each frame. Thus, as shown in Equation 1, an amount of data, transferred, is fixed according to the number of pixels and a magnitude of a signal.

Data Amount Transferred in the case of CIS=The Number of Pixels*The Number of Event Bits  [Equation 1]

On the other hand, in the case of a DVS, an amount of data transferred may be determined according to Equation 2.

Data Amount Transferred in the case of DVS=The Number of Events*(The Number of Address Bits+The Number of Event Bits)  [Equation 2]

As described above, as the resolution of a display is increases, the number of address bits may also be increased. Moreover, as the number of events increases, an amount of data transferred, in the case of DVS, may also be increased, as compared with an amount of data transferred in the case of a CIS.

Thus, according to an embodiment, depending on a result of comparing the number of events counted by the event counters 140 and 240 with a threshold value, determined according to Equation 3, an output signal or an event reading method may be selected.

$$\text{Threshold Value} = \text{The Number of Event Bits} * \text{The Number of Pixels}/(\text{The Number of Address Bits} + \text{The Number of Event Bits}) \quad \text{[Equation 3]}$$

As a result, an electronic device according to an embodiment may output a signal based on the CIS or the DVS, based on the dynamic input. If the number of events is sufficiently large, then data corresponding to the amount of data 33 transferred according to the number of events in a CIS may be preferentially provided. On the other hand, if the number of events is low, the amount of data transferred 32 when an event signal is output in the unit of a frame in a DVS may be preferentially provided. Thus, the dynamic nature of the DVS may be preserved when the number of events is low, while the excessive amount of data transferred may be limited when the number of events is high.

Figure 4:
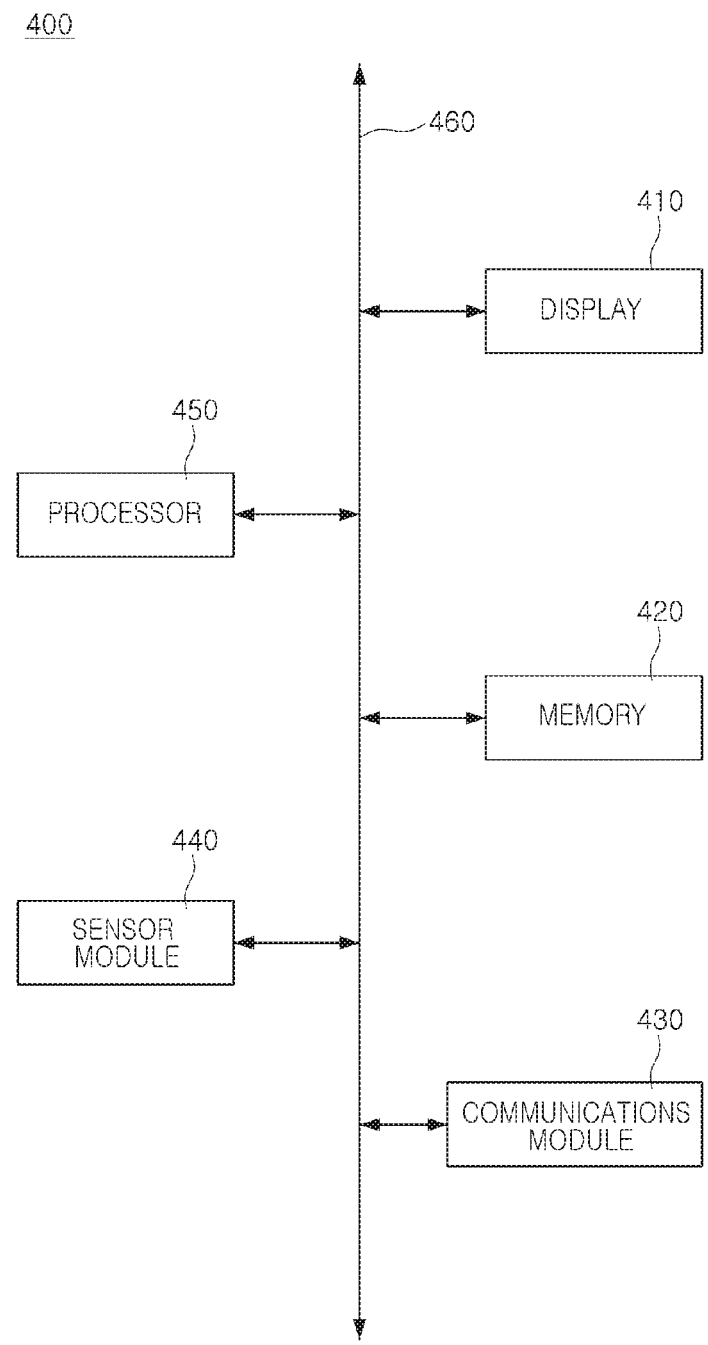
FIG. 4 is a block diagram of an electronic device according to an embodiment.

FIG. 4 is a block diagram of an electronic device according to an embodiment.

Referring to FIG. 4, an electronic device 400 may include a display 410, a memory 420, a communications module 430, a sensor module 440, a processor 450, and the like. The electronic device 400 may be a television, a desktop computer, or the like, in addition to mobile devices such as a smartphone, a tablet PC, a laptop computer, or the like.

Moreover, components configuring the electronic device 400, such as a display 410, a memory 420, a communications module 430, a sensor module 440, a processor 450, and the like, may communicate with each other through a bus 460 to transfer signals and/or data.

The sensor module 440 may be the dynamic vision sensors 100 and 200 described previously with reference to FIG. 1 or FIG. 2, and the sensor module 440 may sense an event and may output a first signal or a second signal according to the number of events having been counted.

In this case, the sensor module 440 may apply one among methods described below to notify a type of a signal, which is output, to a receiving component or device (for example, the processor 450, or the like, or an external electronic device or server): (1) separately allocating an output pin for a first signal and a second signal to output a signal by a dynamic vision sensor; (2) transferring a separate packet for notifying a change in signal to a receiving component or device when a change of a signal, which is output, is required (for example, a changing from a first signal to a second signal or vice versa); and (3) transferring information on a signal, which is periodically output, to a receiving component or device by embedding the information in a packet (for example, for each number of packets, for each unit time, or the like).

Meanwhile, the processor 450 may receive a first signal or a second signal from the sensor module 440 and may process the first signal or the second signal. For example, the processor 450 may determine a type of signal, which is received, according to one among the methods described above, and may process a signal using a suitable method depending on the type of signal.

Figure 5:
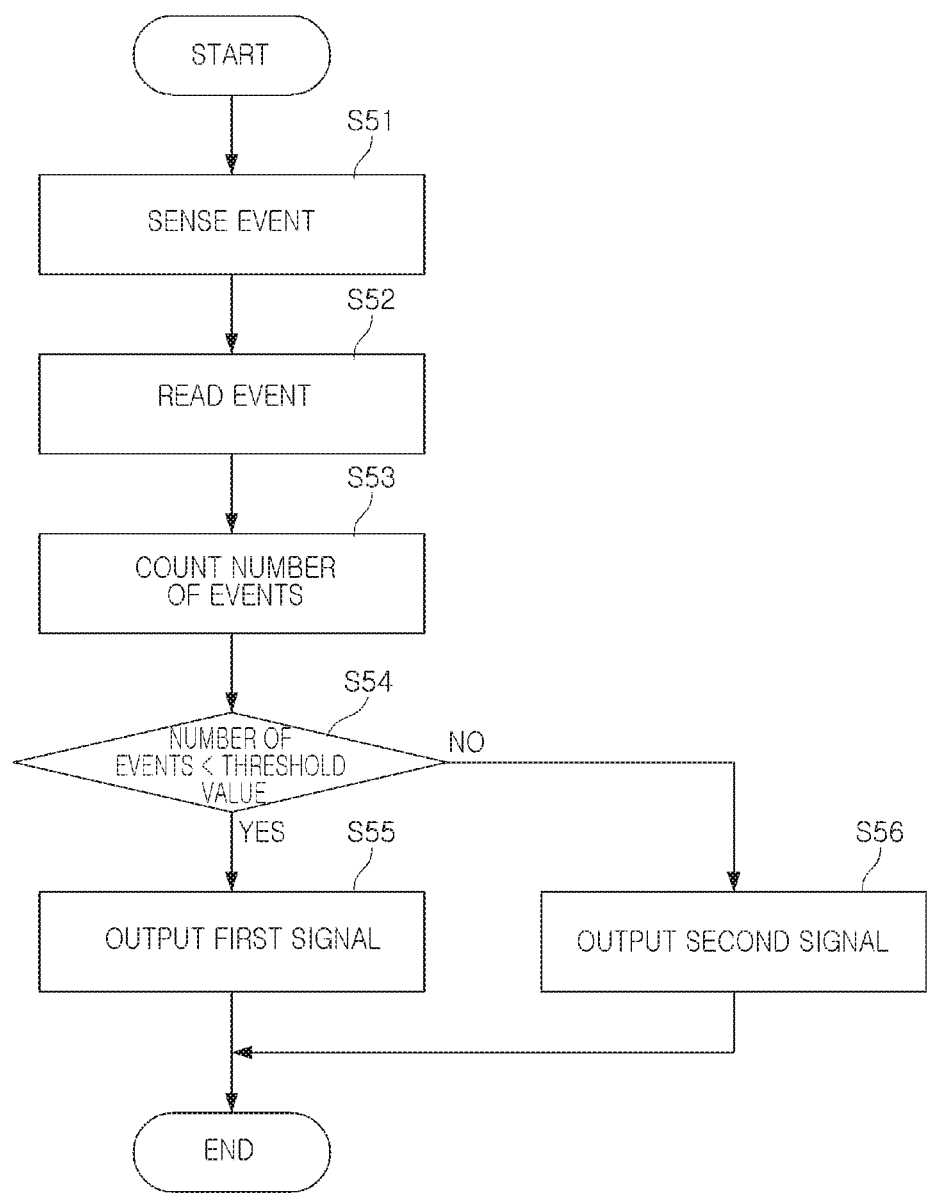
FIG. 5 is a flowchart of a method of a dynamic vision sensor transferring data according to an embodiment.

FIG. 5 is a flowchart of a method of a dynamic vision sensor transferring data according to an embodiment.

Referring to FIG. 5, an event may be sensed through the pixel unit 110 illustrated in FIG. 1 (S51), and a first signal and a second signal may be output by reading respective events through the first reading unit 120 and the second reading unit 130 (S52).

Moreover, the number of events, sensed by the pixel unit 110, may be counted by the event counter 140 (S53), and the number of events having been counted may be compared with a preset threshold value (S54). The selecting unit 150 may output a first signal when the number of events is less than a threshold value (S55), and may output a second signal when the number of events is equal to or greater than the threshold value (S56).

Figure 6:
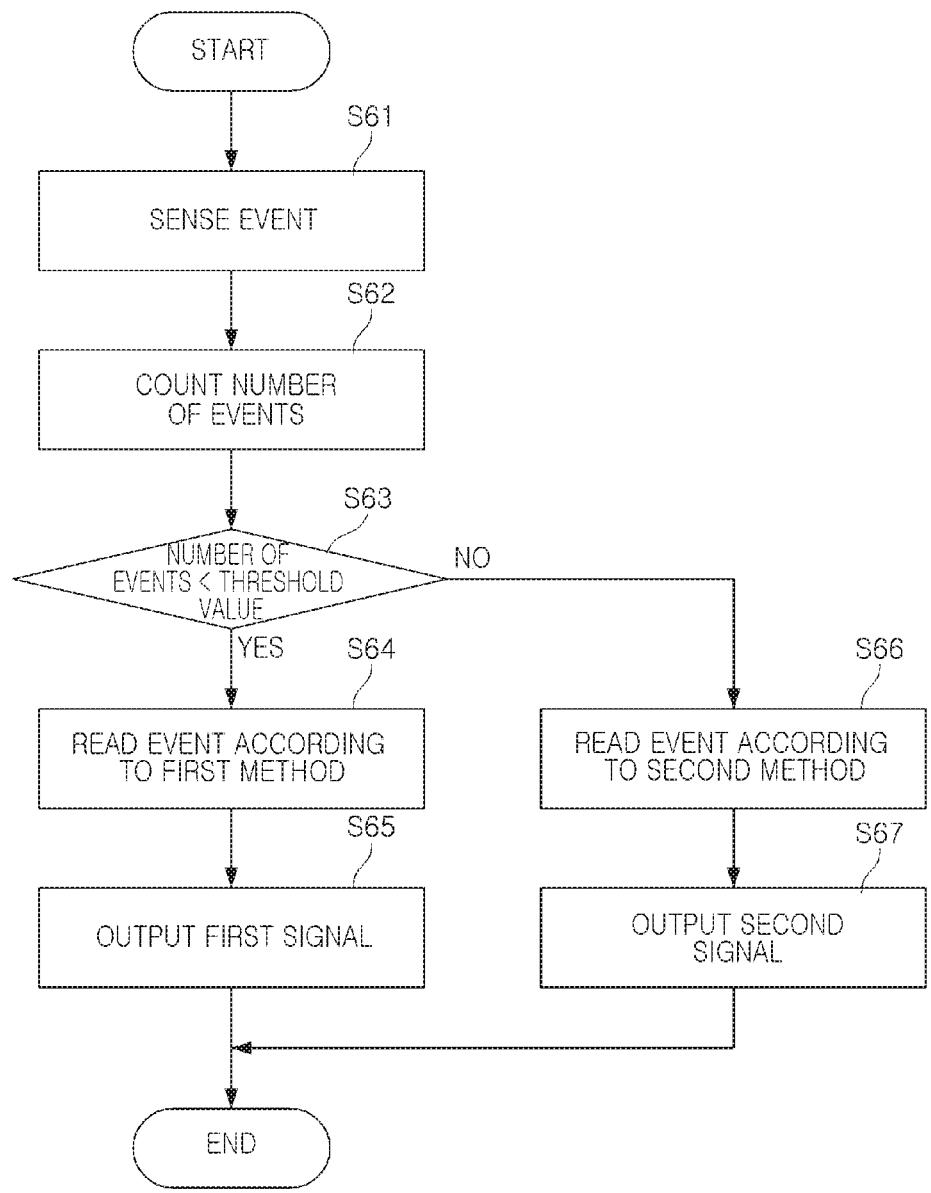
FIG. 6 is a flowchart of a method of a dynamic vision sensor transferring data according to an embodiment.

FIG. 6 is a flowchart of a method of a dynamic vision sensor transferring data according to an embodiment.

Referring to FIG. 6, an event may be sensed through the pixel unit 210 illustrated in FIG. 2 (S61), the number of events sensed by the pixel unit 210 may be counted by the event counter 240 (S62), and the number of events having been counted may be compared with a preset threshold value (S63).

When the number of events is less than a threshold value, the selecting unit 250 may transfer a signal, sensed by the pixel unit 210, to the first reading unit 220, and the first reading unit 220 may read an event according to a first method (S64) and then may output a first signal (S65).

On the other hand, when the number of events is equal to or greater than a threshold value, the selecting unit 250 may transfer a signal sensed by the pixel unit 210 to the second reading unit 230, and the second reading unit 230 may read an event according to a second method (S66) and then may output a second signal (S67).

As set forth above, according to embodiments of the present disclosure, a dynamic vision sensor, an electronic device, and a data transfer method thereof, capable of preventing an amount of data transferred by a dynamic vision sensor, may be provided.

While embodiments have been shown and described above, it will be apparent to those skilled in the art that modifications and variations could be made without departing from the scope of the present disclosure, as defined by the appended claims.

What is claimed is:

1. A dynamic vision sensor, comprising:
    a pixel unit comprising a plurality of pixels, each pixel among the plurality of pixels configured to output an activation signal indicating occurrence of an event, in response to receiving dynamic input;
    a first reading unit configured to output a first signal for processing an event of a pixel of the dynamic vision sensor in which the event occurs, based on the activation signal;
    a second reading unit configured to output a second signal for processing events of all of the plurality of pixels in which the event occurs, based on the activation signal;
    an event counter configured to count a number of events occurring in the pixel unit, based on the activation signal, and to output a selection signal, based on the number of events; and
    a selecting unit configured to select an output signal from among one of the first signal to process the event of the pixel and the second signal to process the event of all of the plurality of pixels, based on the selection signal, and to output the output signal.

2. The dynamic vision sensor of claim 1, wherein the second signal is a signal scanning all of the plurality of pixels included in the pixel unit for each frame.

3. The dynamic vision sensor of claim 1, wherein the event counter outputs a first selection signal selecting an output signal of the first reading unit if the number of events is less than a threshold value, and outputs a second selection signal selecting an output signal of the second reading unit if the number of events is equal to or greater than the threshold value.

4. The dynamic vision sensor of claim 3, wherein the threshold value is determined according to a number of the plurality of pixels included in the pixel unit.

5. The dynamic vision sensor of claim 3, wherein the threshold value is determined according to:

threshold value=number of event bits*number of pixels/(number of address bits+number of event bits).

6. An electronic device, comprising:
a dynamic vision sensor configured to sense events and output a first signal for processing an event of a pixel of the dynamic vision sensor in which an event occurs or a second signal for processing events of all pixels of the dynamic vision sensor in which the events occur according to a number of the events; and
a processor configured to process the event of the pixel based on the first signal or the events of all the pixels based on the second signal received from the dynamic vision sensor.

7. The electronic device of claim 6, wherein the dynamic vision sensor comprises:
a pixel unit comprising a plurality of pixels, each pixel among the plurality of pixels configured to output an activation signal indicating occurrence of an event, in response to receiving dynamic input;
a first reading unit configured to output the first signal, based on the activation signal;
a second reading unit configured to output the second signal, based on the activation signal;
an event counter configured to count the number of events occurring in the pixel unit, based on the activation signal, and to output a selection signal, based on the number of events; and
a selecting unit configured to select an output signal from among one of the first signal to process the event of the pixel and the second signal to process the event of all the pixels, based on the selection signal, and to output the output signal.

8. The electronic device of claim 7, wherein the event counter outputs a first selection signal selecting an output signal of the first reading unit if the number of events is less than a threshold value, and outputs a second selection signal selecting an output signal of the second reading unit if the number of events is equal to or greater than the threshold value.

9. The electronic device of claim 6, wherein the dynamic vision sensor includes:
a pixel unit comprising a plurality of pixels, each pixel among the plurality of pixels configured to output an activation signal indicating occurrence of an event, in response to receiving dynamic input;
a first reading unit configured to output the first signal, based on the activation signal;
a second reading unit configured to output the second signal, based on the activation signal;
an event counter configured to count a number of events occurring in the pixel unit, based on the activation signal, and to output a selection signal, based on the number of events; and
a selecting unit configured to receive the activation signal and the selection signal, and to output the activation signal to one of the first reading unit and the second reading unit, based on the selection signal.

10. The electronic device of claim 9, wherein the event counter outputs a first selection signal selecting the first reading unit if the number of events is less than a threshold value, and outputs a second selection signal selecting the second reading unit if the number of events is equal to or greater than the threshold value.

11. The electronic device of claim 6, wherein the dynamic vision sensor comprises a first output pin allocated for output of the first signal and a second output pin allocated for output of the second signal, and the processor determines a type of signal output by the dynamic vision sensor through the first signal output through the first output pin or the second signal output through the second output pin.

12. The electronic device of claim 6, wherein the dynamic vision sensor transfers a packet for notifying a change in signal to the processor based on a change of an output signal.

13. The electronic device of claim 6, wherein the dynamic vision sensor periodically transfers a packet containing information on an output signal to the processor.

* * * * *